(12) United States Patent  
Lien

(10) Patent No.: US 9,106,240 B1  
(45) Date of Patent: Aug. 11, 2015

(54) MULTIPLYING DIGITAL-TO-ANALOG CONVERTER AND PIPELINE ANALOG-TO-DIGITAL CONVERTER USING THE SAME

(71) Applicant: MediaTek Inc., Hsin-Chu (TW)

(72) Inventor: Yuan-Ching Lien, Taipei (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 14/508,234

(22) Filed: Oct. 7, 2014

Related U.S. Application Data

(60) Provisional application No. 61/931,091, filed on Jan. 24, 2014.

(51) Int. Cl.
| | |
|---|---|
| *H03M 1/66* | (2006.01) |
| *H03M 1/00* | (2006.01) |
| *H03M 1/06* | (2006.01) |
| *H03M 1/18* | (2006.01) |
| *H03M 1/46* | (2006.01) |
| *H03M 1/70* | (2006.01) |
| *H03M 1/72* | (2006.01) |

(52) U.S. Cl.  
CPC ............ *H03M 1/002* (2013.01); *H03M 1/0636* (2013.01); *H03M 1/181* (2013.01); *H03M 1/462* (2013.01); *H03M 1/466* (2013.01); *H03M 1/70* (2013.01); *H03M 1/72* (2013.01)

(58) Field of Classification Search  
CPC ......... H03M 1/466; H03M 1/70; H03M 1/72; H03M 1/462; H03M 1/181; H03M 1/002  
USPC ......................................... 341/155, 144, 150  
See application file for complete search history.

(56) References Cited

U.S. PATENT DOCUMENTS

| | | | | |
|---|---|---|---|---|
| 7,187,318 | B1 * | 3/2007 | Lee et al. ..................... | 341/161 |
| 7,268,720 | B1 * | 9/2007 | Murden et al. ................ | 341/161 |
| 8,120,519 | B2 * | 2/2012 | Bales ............................ | 341/161 |
| 8,830,099 | B1 * | 9/2014 | Straayer et al. ............... | 341/144 |

* cited by examiner

*Primary Examiner* — Brian Young  
(74) *Attorney, Agent, or Firm* — McClure, Qualey & Rodack, LLP

(57) ABSTRACT

A multiplying digital-to-analog converter (MDAC) with high slew rate and a pipeline Analog-to-digital converter using the same. The first set of capacitors for a first input terminal of the operational amplifier (op-amp) includes active capacitors coupling the first input terminal of the op-amp to a first enhanced reference voltage or a common mode terminal in accordance with first digital bits in an amplifying phase of the MDAC, and includes a feedback capacitor coupling the first input terminal of the op-amp to a first output terminal of the op-amp in the amplifying phase. The first set of capacitors contains M capacitor cells. The feedback capacitor between the first set of capacitors contains at most $M/(2^n)$ capacitor cells, where n is a number of effective bits provided by a first analog-to-digital converter generating the first digital bits for the active capacitors.

18 Claims, 5 Drawing Sheets

MULTIPLYING DIGITAL-TO-ANALOG CONVERTER AND PIPELINE ANALOG-TO-DIGITAL CONVERTER USING THE SAME

CROSS REFERENCE TO RELATED APPLICATIONS

This application claims the benefit of U.S. Provisional Application No. 61/931,091 filed Jan. 24, 2014, the entirety of which is incorporated by reference herein.

BACKGROUND OF THE INVENTION

1. Field of the Invention

The present invention relates to a multiplying digital-to-analog converter (MDAC) and in particular it relates to a pipeline analog-to-digital converter (pipeline ADC) using an MDAC.

2. Description of the Related Art

The pipeline ADC has become a popular ADC architecture, which is used in a wide range of applications, including CCD imaging, ultrasonic medical imaging, digital receivers, base stations, digital video (for example, HDTV), xDSL, cable modems, fast Ethernet, and so on.

A traditional pipeline ADC, however, consumes considerable power in the operational amplifier(s). The problem becomes more evident in nanometer CMOS technologies since high-gain operational amplifiers designed with shrinking values of VDD and intrinsic transistor gain consume significant power.

BRIEF SUMMARY OF THE INVENTION

An MDAC and a pipeline ADC using the same are disclosed.

An MDAC in accordance with an exemplary embodiment of the disclosure includes an operational amplifier and a first set of capacitors. In a sampling phase of the MDAC, the first set of capacitors are coupled in parallel between a first analog input of the MDAC and a first input terminal of the operational amplifier. The first set of capacitors includes active capacitors coupling the first input terminal of the operational amplifier to a first enhanced reference voltage or a common mode terminal in accordance with first digital bits in an amplifying phase of the MDAC. Furthermore, the first set of capacitors includes a feedback capacitor coupling the first input terminal of the operational amplifier to a first output terminal of the operational amplifier in the amplifying phase. The first digital bits are generated from a first analog-to-digital converter. The first set of capacitors contains M capacitor cells, where M is a number. The feedback capacitor between the first set of capacitors contains at most M/(2$^n$) capacitor cells, where n is a number of effective bits provided by the first analog-to-digital converter. The voltage difference between the first enhanced reference voltage and a second enhanced reference voltage is greater than 0.5·Vi_pp, where Vi_pp is a peak-to-peak differential voltage value of an analog signal formed between the first analog input and a second analog input of the MDAC. The second enhanced reference voltage and the second analog input are provided for a second input terminal of the operational amplifier.

In an exemplary embodiment of the disclosure, a pipeline ADC is shown. In addition to the aforementioned MDAC and the first analog-to-digital converter, the pipeline ADC further includes a second analog-to-digital converter and a processing unit. The processing unit is for time alignment and digital error correction. The MDAC is coupled to an analog input of the pipeline ADC via the first analog input and the second analog input of the MDAC. The second analog-to-digital converter is coupled to the first and second output terminals of the operational amplifier of the MDAC to generate second digital bits. The processing unit receives the first digital bits and the second digital bits for generation of a digital output of the pipeline ADC. The first analog-to-digital converter generates the first digital bits based on the analog signal formed between the first analog input and the second analog input of the MDAC.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
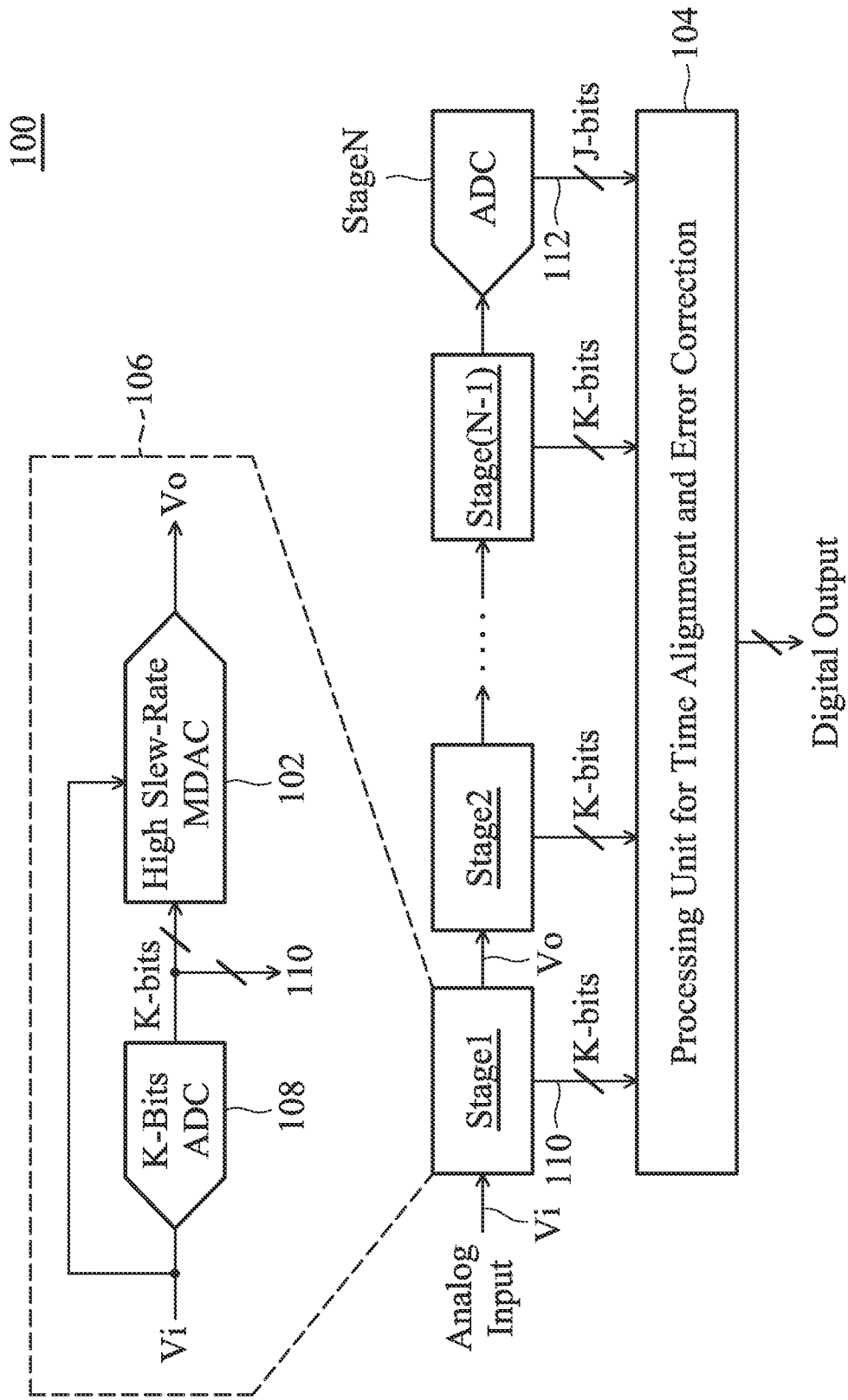
FIG. 1 illustrates a pipeline ADC 100 using an MDAC 102 in accordance with an exemplary embodiment of the disclosure.

FIG. 1 illustrates a pipeline ADC 100 using an MDAC 102 in accordance with an exemplary embodiment of the disclosure. The pipeline ADC 100 includes N stages numbered from Stage1 to StageN and a processing unit 104. The last stage StageN is an analog-to-digital converter (ADC), e.g. a flash ADC or a successive approximation register ADC (abbreviated to SAR ADC). A proposed circuit 106 for the stages Stage1 to Stage(N−1) is shown and discussed in the following paragraphs, which includes an ADC 108 as well as the MDAC 102.

As shown, an analog input of the pipeline ADC 100 is received by the circuit 106 in the first stage Stage1 as an analog signal Vi. The ADC 108 converts the analog signal Vi into digital bits 110 (e.g. K-bits). The MDAC 102 receives the digital bits 110 and the analog signal Vi and generates an analog signal Vo for the next stage Stage2. The digital bits 110 are further conveyed to the processing unit 106. With an architecture similar to circuit 106, stages Stage2 to Stage(N−1) are provided and cascaded after the stage Stage1, each providing K-bits to the processing unit 106. The last stage StageN, an ADC, receives the analog signal from the previous stage Stage(N−1) and outputs the digital bits 112 (e.g. J-bits). In accordance with the digital bits received from the stages Stage1 to StageN, the processing unit 104 for time alignment and error correction generates the digital output of the pipeline ADC 100.

Figure 2:
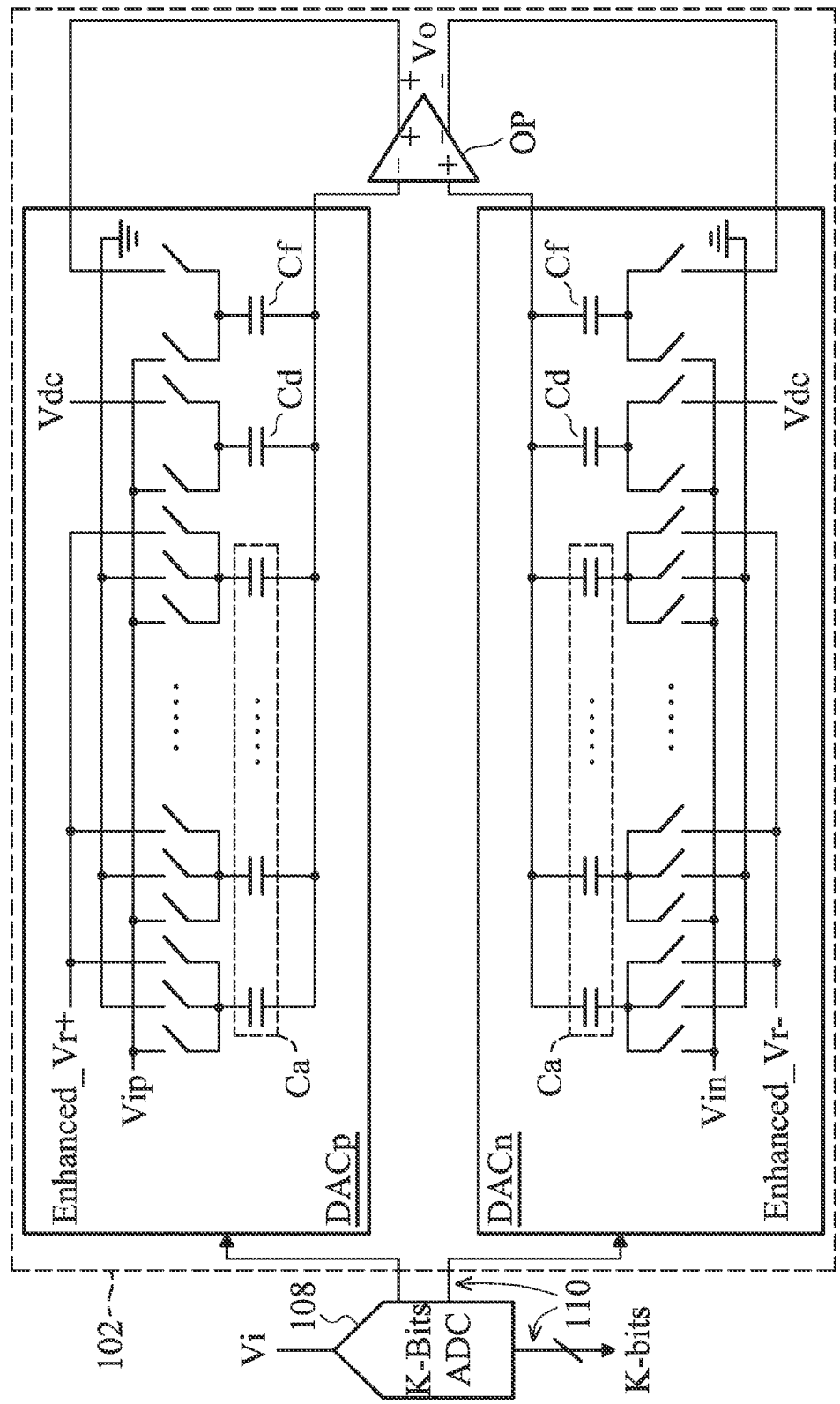
FIG. 2 illustrates the MDAC 102 in detail in accordance with an exemplary embodiment of the disclosure.

FIG. 2 illustrates the MDAC 102 in detail in accordance with an exemplary embodiment of the disclosure, which includes an operational amplifier OP in a differential architecture, a capacitor circuit DACp, and a capacitor circuit DACn. The analog signal Vi received by the ADC 108 is further conveyed into the MDAC 102 as the difference between a positive analog input Vip and a negative analog input Vin. The positive analog input Vip and an enhanced positive reference voltage Enhanced_Vr+ are coupled to the capacitor circuit DACp. The negative analog input Vin and an enhanced negative reference voltage Enhanced_Vr− are coupled to the capacitor circuit DACn. The MDAC 102 provides a sampling phase and an amplifying phase to switch the statuses of the capacitor circuits DACp and DACn.

The capacitor circuit DACp includes active capacitors Ca, a disabled capacitor Cd and a feedback capacitor Cf, formed by M capacitor cells. In the sampling phase, the active capacitors Ca, the disabled capacitor Cd and the feedback capacitor Cf are coupled in parallel between the positive analog input Vip and a negative input terminal '−' of the operational amplifier OP. In the amplifying phase, the active capacitors Ca are switched to couple the negative input terminal '−' of the operational amplifier OP to the enhanced positive reference voltage Enhanced_Vr+ or a common mode terminal (e.g., ground) in accordance with the digital bits 110. The disabled capacitor Cd is switched to couple the negative input terminal '−' of the operational amplifier OP to a dc terminal Vdc (e.g., ground or any constant voltage level) in the amplifying phase. The feedback capacitor Cf is switched to couple the negative input terminal '−' of the operational amplifier OP to a positive output terminal '+' of the operational amplifier OP in the amplifying phase.

The capacitor circuit DACn includes active capacitors Ca, a disabled capacitor Cd and a feedback capacitor Cf, formed by M capacitor cells. In the sampling phase, the active capacitors Ca, the disabled capacitor Cd and the feedback capacitor Cf are coupled in parallel between the negative analog input Vin and a positive input terminal '+' of the operational amplifier OP. In the amplifying phase, the active capacitors Ca are switched to couple the positive input terminal '+' of the operational amplifier OP to the enhanced negative reference voltage Enhanced_Vr− or the common mode terminal (e.g., ground) in accordance with the digital bits 110. The disabled capacitor Cd is switched to couple the positive input terminal '+' of the operational amplifier OP to the dc terminal Vdc in the amplifying phase. The feedback capacitor Cf is switched to couple the positive input terminal '+' of the operational amplifier OP to a negative output terminal '−' of the operational amplifier OP in the amplifying phase. Note that in the amplifying phase the active capacitors Ca of the capacitor circuit DACn are controlled in opposite way to the active capacitors Ca of the capacitor circuit DACp. When an active capacitor in the capacitor circuit DACp is controlled to couple to the enhanced positive reference voltage Enhanced_Vr+, the corresponding active capacitor in the capacitor circuit DACn is coupled to the common mode terminal (e.g. ground). When an active capacitor in the capacitor circuit DACp is controlled to couple to the common mode terminal (e.g. ground), the corresponding active capacitor in the capacitor circuit DACn is coupled to the enhanced negative reference voltage Enhanced_Vr−.

Note that the disabled capacitor Cd of the capacitor circuit DACp and the disabled capacitor Cd of the capacitor circuit DACn are optional.

The feedback capacitor Cf of the capacitor circuit DACp contains at most $M/(2^n)$ capacitor cells, where n is a number of effective bits provided by the ADC 108. The feedback capacitor Cf of the capacitor circuit DACn contains the same number of capacitor cells as the feedback capacitor Cf of the capacitor circuit DACp. In this manner, a high gain between the analog signal Vo and the analog signal Vi is provided. It means that a high slew-rate MDAC is provided, which is advantageous to the operations of the pipeline ADC 100. To control the swing of the analog signal Vo within a proper range for improving the MDAC power efficiency, (Enhanced_Vr+−Enhanced_Vr−), voltage difference between the enhanced positive reference voltage Enhanced_Vr+ and the enhanced negative reference voltage Enhanced_Vr− is greater than 0.5·Vi_pp, where Vi_pp is a peak-to-peak differential voltage value of the analog signal Vi formed between the positive analog input Vip and the negative analog input Vin of the MDAC 102. For example, when Vi_pp, the peak-to-peak differential voltage value of the analog signal Vi, is 1.2V, (Enhanced_Vr+−Enhanced_Vr−) may be 0.8V, greater than 0.6V. In an exemplary embodiment, the enhanced positive reference voltage Enhanced_Vr+ is 0.8V (high enough to turn on the transistors in the capacitor circuit DACp) and the enhanced negative reference voltage Enhanced_Vr− is ground—only one voltage generator circuit is required (for the generation of the 0.8 V). The cost of MDAC is lowered.

This paragraph shows how to design the enhanced positive reference voltage Enhanced_Vr+ and the enhanced positive reference voltage Enhanced_Vr− when the capacitor circuits DACp and DACn provide no disabled capacitor (Cd). In this example, the feedback capacitor Cf of the capacitor circuit DACp contains p capacitor cells, the feedback capacitor Cf of the capacitor circuit DACn contains p capacitor cells, the active capacitors Ca of the capacitor circuit DACp contain (M−p) capacitor cells, and the active capacitors Ca of the capacitor circuit DACn contain (M−p) capacitor cells. The voltage difference, (Enhanced_Vr+−Enhanced_Vr−), between the enhanced positive reference voltage Enhanced_Vr+ and the enhanced negative reference voltage Enhanced_Vr− may be set to 0.5·Vi_pp·M/(M−p), which is sufficient to control the swing of the analog signal Vo within a proper range for improving the MDAC power efficiency.

This paragraph shows how to design the enhanced positive reference voltage Enhanced_Vr+ and the enhanced positive reference voltage Enhanced_Vr− when disabled capacitors Cd are provided in the capacitor circuits DACp and DACn. In this example, the feedback capacitor Cf of the capacitor circuit DACp contains p capacitor cells, the feedback capacitor Cf of the capacitor circuit DACn contains p capacitor cells, the disabled capacitor Cd of the capacitor circuit DACp contains q capacitor cells, the disabled capacitor Cd of the capacitor circuit DACn contains q capacitor cells, the active capacitors Ca of the capacitor circuit DACp contain (M−p−q) capacitor cells, and the active capacitors Ca of the capacitor circuit DACn contain (M−p−q) capacitor cells. The voltage difference, (Enhanced_Vr+−Enhanced_Vr−), between the enhanced positive reference voltage Enhanced_Vr+ and the enhanced negative reference voltage Enhanced_Vr− may be set to 0.5·Vi_pp·M/(M−p−q), which is sufficient to control the swing of the analog signal Vo within a proper range for improving the MDAC power efficiency.

Furthermore, the number M is determined according to a limitation for thermal noise of MDAC.

Figure 3:
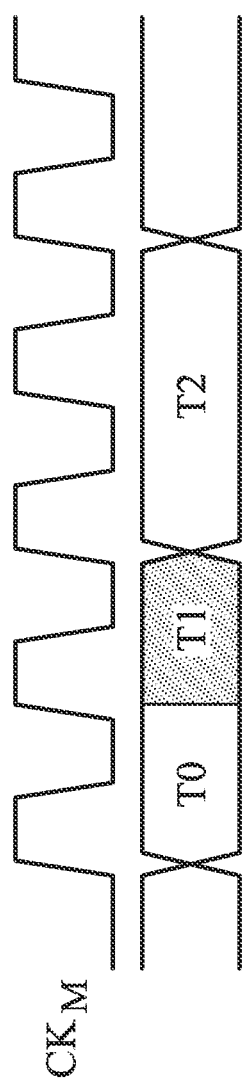
FIG. 3 is a timing diagram of an MDAC in accordance with an exemplary embodiment of the disclosure.

FIG. 3 is a timing diagram of an MDAC in accordance with an exemplary embodiment of the disclosure. A clock signal $CK_M$ is provided to operate the MDAC. The time interval T0 is for the sampling phase of the MDAC. The time interval T1 is provided for the stabilization of the ADC 108. After the time interval T1, the digital bits 110 are stable and a time interval T2 is provided for the amplifying phase of the MDAC. However, it is not intended to limit the control scheme of the disclosed MDAC to that timing diagram of FIG. 3.

Figure 4:
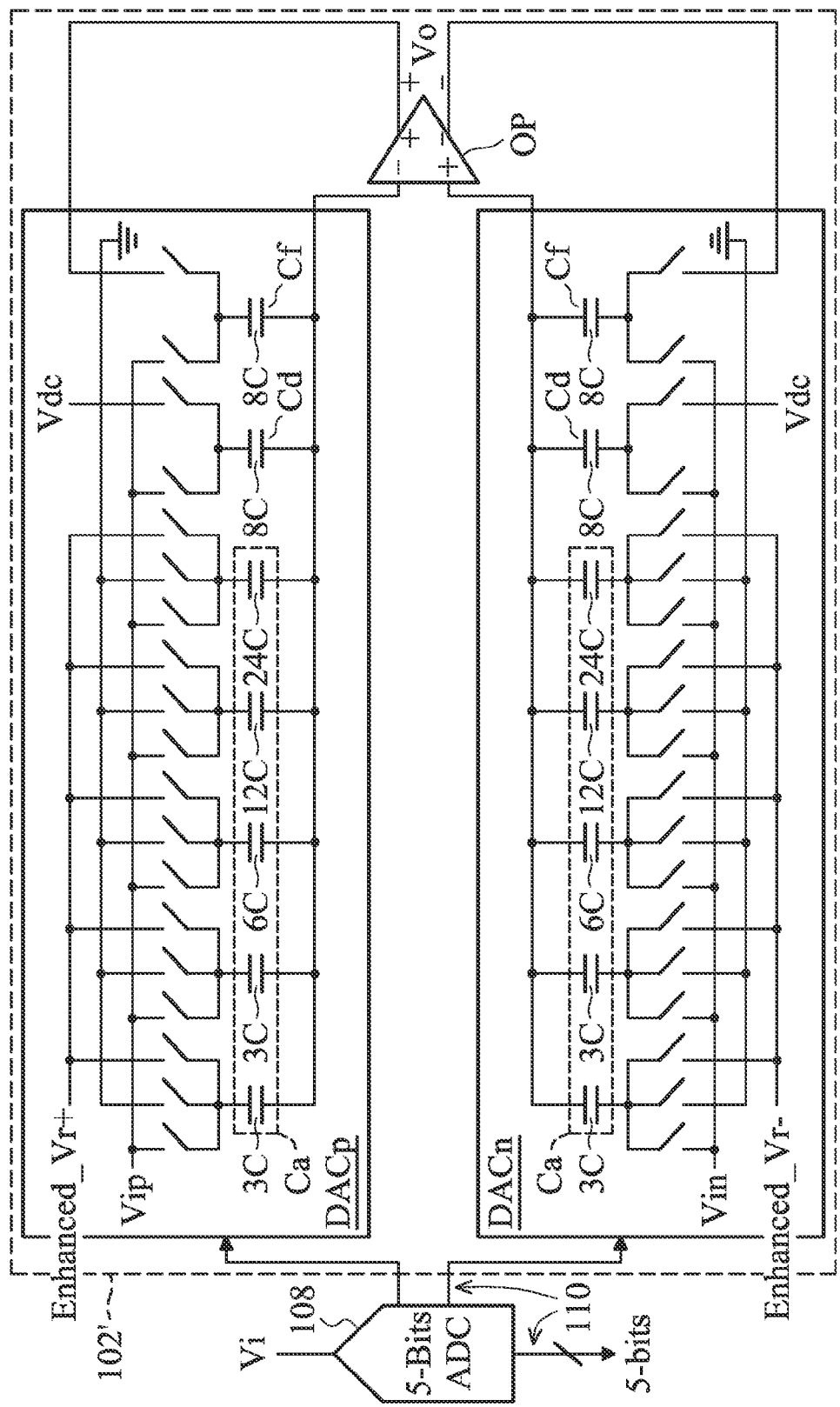
FIG. 4 illustrates an MDAC 102' in accordance with another exemplary embodiment of the disclosure.
Figure 5:
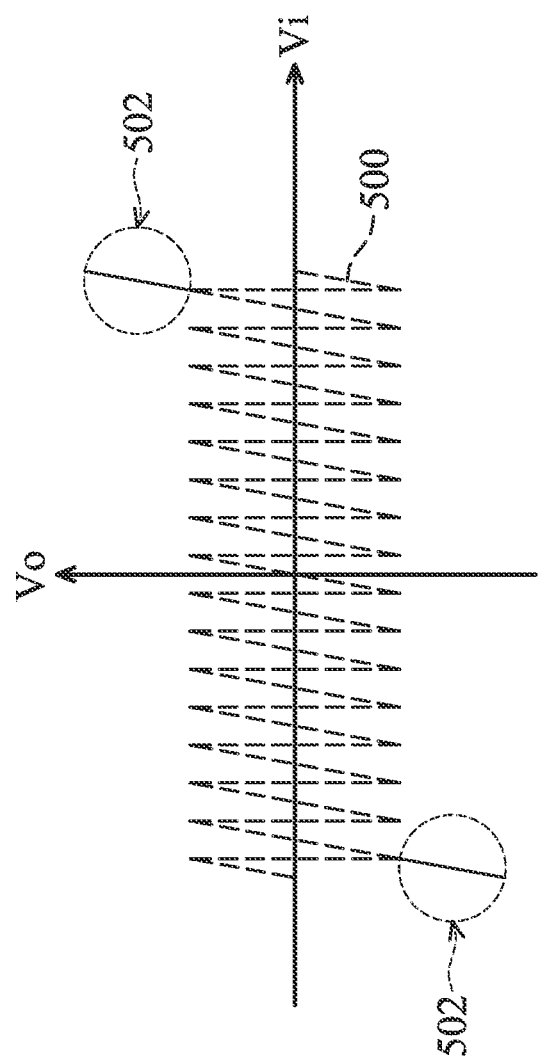
FIG. 5 shows a waveform 500 representing a transfer function between Vo and Vi of the MDAC 102'.

FIG. 4 illustrates an MDAC 102' in accordance with another exemplary embodiment of the disclosure. The ADC 108 is a 5-bits ADC, which outputs 5 digital bits with 3 effective bits, i.e., K=5 and n=3. The capacitor circuit DACp and the capacitor circuit DACn both contain 64 capacitor cells (64C), i.e., M=64. The feedback capacitor Cf of the capacitor circuit DACp and the feedback capacitor Cf of the capacitor circuit DACn both contain 8 capacitor cells (8C), i.e., p=8, not greater than $M/2^n$. Thus, the gain between the analog signal Vo and the analog signal Vi is 8 (calculated from M/p), which is quite high and results in a high slew rate. To control the swing of the analog output Vo, 8 capacitor cells (8C, i.e. q=8) are used as the disabled capacitor Cd in the capacitor circuit DACp and 8 capacitor cells are used as the disabled capacitor Cd in the capacitor circuit DACn and the voltage difference, (Enhanced_Vr+−Enhanced_Vr−), between the enhanced positive reference voltage Enhanced_Vr+ and the enhanced negative reference voltage Enhanced_Vr− is set to $2 \cdot Vi\_pp/3$ (calculated from $0.5 \cdot Vi\_pp \cdot M/(M-p-q)$). In each capacitor circuit DACp/DACn, the remaining 48 capacitor cells (48C) form 5 active capacitors, 3C, 3C, 6C, 12C and 24C, to be switched in accordance with the 5 digital bits 110, respectively, in the amplifying phase. FIG. 5 shows a waveform 500 representing a transfer function between Vo and Vi of the MDAC 102'. The swing 502 of the analog signal Vo in a traditional design is suppressed. The swing of the analog signal Vo is controlled within a smaller range (Vo is halved for an ideal case). An MDAC with a high slew-rate and high power efficiency is achieved without affecting the bandwidth of the MDAC.

In some exemplary embodiments, the capacitor circuit DACp and the capacitor circuit DACn may be asymmetrical, depending on user's requirements.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A multiplying digital-to-analog converter, comprising:
an operational amplifier; and
a first set of capacitors, coupled in parallel between a first analog input of the multiplying digital-to-analog converter and a first input terminal of the operational amplifier in a sampling phase of the multiplying digital-to-analog converter, and including active capacitors coupling the first input terminal of the operational amplifier to a first enhanced reference voltage or a common mode terminal in accordance with first digital bits in an amplifying phase of the multiplying digital-to-analog converter, and including a feedback capacitor coupling the first input terminal of the operational amplifier to a first output terminal of the operational amplifier in the amplifying phase,
wherein:
the first digital bits are generated from a first analog-to-digital converter;
the first set of capacitors contains M capacitor cells, where M is a number;
the feedback capacitor between the first set of capacitors contains at most $M/(2^n)$ capacitor cells, where n is a number of effective bits provided by the first analog-to-digital converter; and
a voltage difference between the first enhanced reference voltage and a second enhanced reference voltage is greater than $0.5 \cdot Vi\_pp$, where $Vi\_pp$ is a peak-to-peak differential voltage value of an analog signal formed between the first analog input and a second analog input of the multiplying digital-to-analog converter, the second enhanced reference voltage and the second analog input are provided for a second input terminal of the operational amplifier.

2. The multiplying digital-to-analog converter as claimed in claim 1, wherein:
the feedback capacitor between the first set of capacitors contains p capacitor cells, where p is a number;
the active capacitors between the first set of capacitors contain (M−p) capacitor cells; and
the voltage difference between the first enhanced reference voltage and the second enhanced reference voltage is $0.5 \cdot Vi\_pp \cdot M/(M-p)$.

3. The multiplying digital-to-analog converter as claimed in claim 1, further comprising:
a second set of capacitors provided for the second input terminal of the operational amplifier.

4. The multiplying digital-to-analog converter as claimed in claim 3, wherein:
the first set of capacitors includes a disabled capacitor coupling the first input terminal of the operational amplifier to a dc terminal in the amplifying phase; and
the second set of capacitors includes a disabled capacitor coupling the second input terminal of the operational amplifier to the dc terminal in the amplifying phase.

5. The multiplying digital-to-analog converter as claimed in claim 4, wherein:
the feedback capacitor between the first set of capacitors contains p capacitor cells, where p is a number;
the disabled capacitor between the first set of capacitors contains q capacitor cells, where q is a number; and
the voltage difference between the first enhanced reference voltage and the second enhanced reference voltage is $0.5 \cdot Vi\_pp \cdot M/(M-p-q)$.

6. The multiplying digital-to-analog converter as claimed in claim 1, wherein one of the first enhanced reference voltage and the second enhanced reference voltage is ground.

7. The multiplying digital-to-analog converter as claimed in claim 1, wherein the number M is determined according to a limitation for thermal noise of the multiplying digital-to-analog converter.

8. The multiplying digital-to-analog converter as claimed in claim 3, wherein:
the second set of capacitors are coupled in parallel between the second analog input and the second input terminal of the operational amplifier in the sampling phase, and includes active capacitors coupling the second input terminal of the operational amplifier to the second enhanced reference voltage or the common mode terminal in accordance with the first digital bits in the amplifying phase, and includes a feedback capacitor coupling the second input terminal of the operational amplifier to a second output terminal of the operational amplifier in the amplifying phase;
the second set of capacitors contains M capacitor cells; and
the feedback capacitor between the second set of capacitors contains the same number of capacitor cells as the feedback capacitor between the first set of capacitors.

9. The multiplying digital-to-analog converter as claimed in claim 8, wherein:
- the feedback capacitor between the first set of capacitors contains p capacitor cells, where p is a number;
- the feedback capacitor between the second set of capacitors contains p capacitor cells;
- the active capacitors between the first set of capacitors contain (M−p) capacitor cells;
- the active capacitors between the second set of capacitors contain (M−p) capacitor cells; and
- the voltage difference between the first enhanced reference voltage and the second enhanced reference voltage is 0.5·Vi_pp·M/(M−p).

10. The multiplying digital-to-analog converter as claimed in claim 8, wherein:
- the first set of capacitors includes a disabled capacitor coupling the first input terminal of the operational amplifier to a dc terminal in the amplifying phase; and
- the second set of capacitors includes a disabled capacitor coupling the second input terminal of the operational amplifier to the dc terminal in the amplifying phase.

11. The multiplying digital-to-analog converter as claimed in claim 10, wherein:
- the feedback capacitor between the first set of capacitors contains p capacitor cells, where p is a number;
- the feedback capacitor between the second set of capacitors contains p capacitor cells;
- the disabled capacitor between the first set of capacitors contains q capacitor cells, where q is a number;
- the disabled capacitor between the second set of capacitors contains q capacitor cells; and
- the voltage difference between the first enhanced reference voltage and the second enhanced reference voltage is 0.5·Vi_pp·M/(M−p−q).

12. The multiplying digital-to-analog converter as claimed in claim 8, wherein:
- the first analog input and the second analog input respectively receive a positive analog signal and a negative analog signal forming the analog signal;
- a negative input terminal and a positive input terminal of the operational amplifier work as the first input terminal and the second input terminal of the operational amplifier, respectively;
- a positive output terminal and a negative output terminal of the operational amplifier work as the first output terminal and the second output terminal of the operational amplifier, respectively; and
- an enhanced positive reference voltage and an enhanced negative reference voltage play the roles of the first enhanced reference voltage and the second enhanced reference voltage, respectively.

13. The multiplying digital-to-analog converter as claimed in claim 12, wherein:
- the feedback capacitor between the first set of capacitors contains p capacitor cells, where p is a number;
- the feedback capacitor between the second set of capacitors contains p capacitor cells;
- the active capacitors between the first set of capacitors contain (M−p) capacitor cells;
- the active capacitors between the second set of capacitors contain (M−p) capacitor cells; and
- the voltage difference between the enhanced positive reference voltage and the enhanced negative reference voltage is 0.5·Vi_pp·M/(M−p).

14. The multiplying digital-to-analog converter as claimed in claim 12, wherein:
- the first set of capacitors includes a disabled capacitor coupling the negative input terminal of the operational amplifier to a dc terminal in the amplifying phase; and
- the second set of capacitors includes a disabled capacitor coupling the positive input terminal of the operational amplifier to the dc terminal in the amplifying phase.

15. The multiplying digital-to-analog converter as claimed in claim 14, wherein:
- the feedback capacitor between the first set of capacitors contains p capacitor cells, where p is a number;
- the feedback capacitor between the second set of capacitors contains p capacitor cells;
- the disabled capacitor between the first set of capacitors contains q capacitor cells, where q is a number;
- the disabled capacitor between the second set of capacitors contains q capacitor cells; and
- the voltage difference between the enhanced positive reference voltage and the enhanced negative reference voltage is 0.5·Vi_pp·M/(M−p−q).

16. The multiplying digital-to-analog converter as claimed in claim 12, wherein the enhanced negative reference voltage is ground.

17. The multiplying digital-to-analog converter as claimed in claim 12, wherein the number M is determined according to a limitation for thermal noise of the multiplying digital-to-analog converter.

18. A pipeline analog-to-digital converter, comprising:
- the multiplying digital-to-analog converter as claimed in claim 1 and coupled to an analog input of the pipeline analog-to-digital converter via the first analog input and the second analog input of the multiplying digital-to-analog converter;
- the first analog-to-digital converter that provides the multiplying digital-to-analog converter with the first digital bits;
- a second analog-to-digital converter, coupled to the first and second output terminals of the operational amplifier of the multiplying digital-to-analog converter to generate second digital bits; and
- a processing unit for time alignment and digital error correction, receiving the first digital bits and the second digital bits for generation of a digital output of the pipeline analog-to-digital converter,
- wherein the first analog-to-digital converter generates the first digital bits based on the analog signal formed between the first analog input and the second analog input of the multiplying digital-to-analog converter.

* * * * *